(12) United States Patent
Feng

(10) Patent No.: US 9,543,237 B2
(45) Date of Patent: Jan. 10, 2017

(54) SEMICONDUCTOR PACKAGE STRUCTURE

(71) Applicant: ALi Corporation, Hsinchu (TW)

(72) Inventor: Lo-Tien Feng, Hsinchu (TW)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 14/747,641

(22) Filed: Jun. 23, 2015

(65) Prior Publication Data
US 2016/0181185 A1    Jun. 23, 2016

(30) Foreign Application Priority Data

Dec. 23, 2014   (TW) .............................. 103144986 A

(51) Int. Cl.
*H01L 23/495* (2006.01)
*H01L 23/31* (2006.01)

(52) U.S. Cl.
CPC ... *H01L 23/49541* (2013.01); *H01L 23/49551* (2013.01); *H01L 23/49555* (2013.01); *H01L 2224/48247* (2013.01); *H01L 2924/0002* (2013.01)

(58) Field of Classification Search
CPC ........... H01L 21/4842; H01L 23/49555; H01L 2924/0002; H01L 2924/00; H01L 29/49121; H01L 23/48; H01L 23/495
USPC ........ 257/666, 667, E23.048, 696, 698, 676
See application file for complete search history.

(56) References Cited

U.S. PATENT DOCUMENTS

| | | | |
|---|---|---|---|
| 5,420,758 A * | 5/1995 | Liang | H01L 23/49811 257/666 |
| 5,554,050 A * | 9/1996 | Marpoe, Jr. | H01R 13/7195 333/181 |
| 6,258,629 B1 * | 7/2001 | Niones | H01L 23/49524 257/672 |
| 7,449,370 B2 * | 11/2008 | Tanaka | H01L 23/49562 257/672 |
| 8,571,229 B2 | 10/2013 | Chao et al. | |
| 2001/0054751 A1 * | 12/2001 | Toyosawa | H01L 23/3107 257/668 |
| 2002/0089042 A1 * | 7/2002 | Madrid | H01L 21/4842 257/666 |
| 2002/0105060 A1 * | 8/2002 | Misumi | H01L 23/49503 257/666 |
| 2005/0212116 A1 * | 9/2005 | Shimanuki | H01L 23/3107 257/702 |
| 2007/0023872 A1 * | 2/2007 | Shen | H01L 23/3107 257/666 |
| 2007/0040247 A1 * | 2/2007 | Lee | H01L 23/4951 257/666 |
| 2007/0215996 A1 * | 9/2007 | Otremba | H01L 23/4334 257/678 |

(Continued)

FOREIGN PATENT DOCUMENTS

TW    200503208 A    1/2005

OTHER PUBLICATIONS

Taiwanese Office Action dated May 9, 2016.

*Primary Examiner* — Alexander Oscar Williams
(74) *Attorney, Agent, or Firm* — Rabin & Berdo, P.C.

(57) ABSTRACT

A semiconductor package structure includes a lead frame, a chip and a molding compound. The lead frame includes a tray pad and a plurality of leads. Two of the leads are different in height positions. The chip is disposed on the tray. The molding compound encapsulates the chip and a portion of each lead.

11 Claims, 3 Drawing Sheets

(56) References Cited

U.S. PATENT DOCUMENTS

2010/0244214 A1* 9/2010 Arita ................... H01L 23/3107
257/676
2011/0062567 A1* 3/2011 Hsu ................... H01L 23/49541
257/670

* cited by examiner

SEMICONDUCTOR PACKAGE STRUCTURE

This application claims the benefit of Taiwan application Serial No. 103144986, filed Dec. 23, 2014, the subject matter of which is incorporated herein by reference.

BACKGROUND OF THE INVENTION

Field of the Invention

The invention relates in general to a semiconductor package structure, and more particularly to a semiconductor package structure whose leads are different in height position.

Description of the Related Art

In convention semiconductor package structure, in order to reduce the interference of the signal crosstalk, every several leads, one lead is selected as a grounding lead for reducing the interference of the signal crosstalk. However, the number of the signal leads is reduced.

Thus, how to reduce the interference of the signal crosstalk without reducing the number of the signal leads has become a prominent task for the industries.

SUMMARY OF THE INVENTION

The invention is directed to a semiconductor package structure capable of the interference of the signal crosstalk for being conducive to high speed transmission.

According to one embodiment of the present invention, a semiconductor package structure is provided. The semiconductor package structure includes a lead frame, a chip and a molding compound. The lead frame includes a tray and a plurality of leads, wherein two of the leads are different in height position. The chip is disposed on the tray. The molding compound encapsulates the chip and a portion of each lead.

According to another embodiment of the present invention, a semiconductor package structure is provided. The semiconductor package structure includes a lead frame, a chip and a molding compound. The lead frame includes a tray and a plurality of leads, wherein at least one portion of two of the leads are staggered. The chip is disposed on the tray. The molding compound encapsulates the chip and a portion of each lead.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
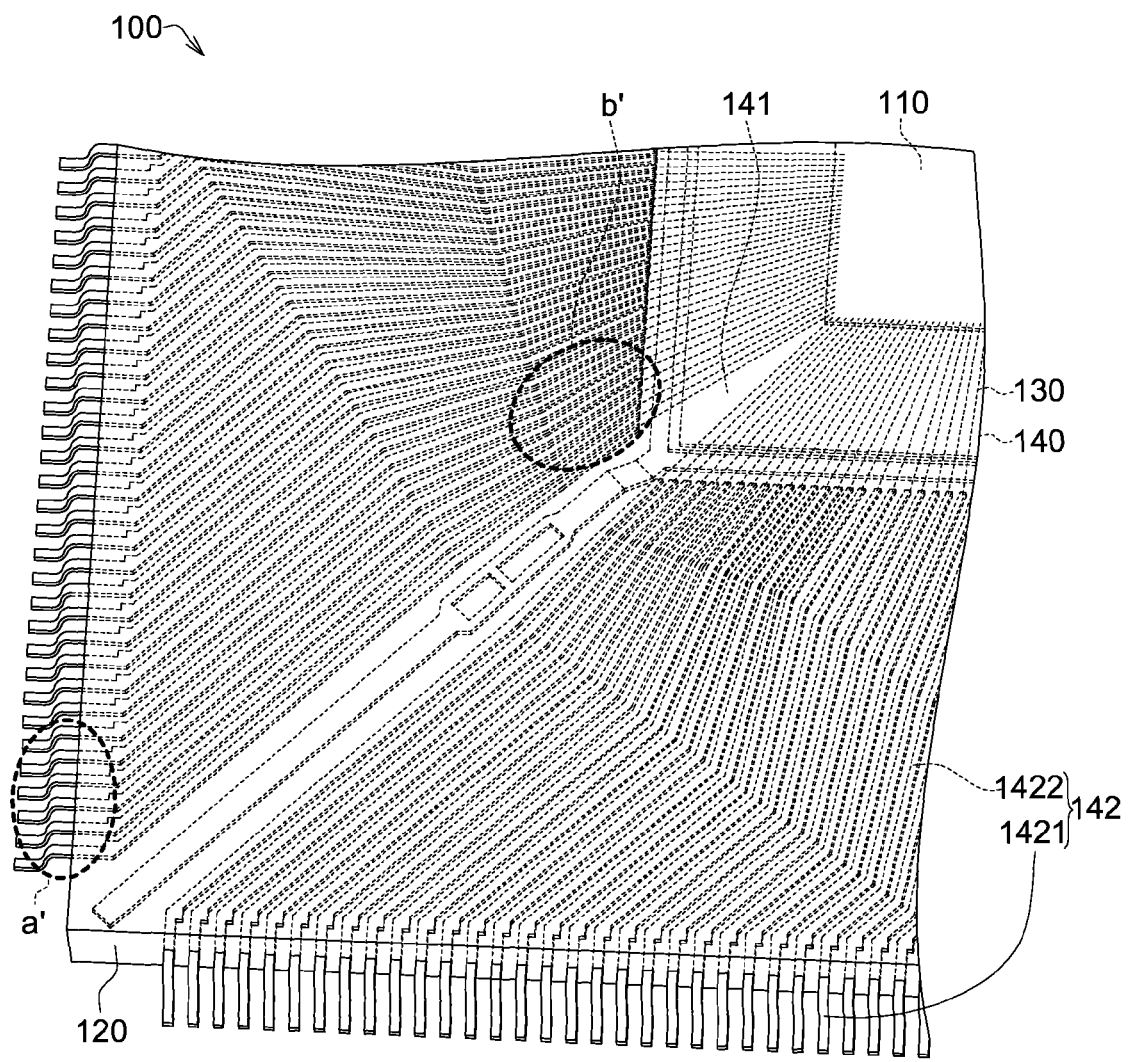
FIG. 1 shows a local diagram of a semiconductor package structure according to an embodiment of the invention.

FIG. 1 shows a local diagram of a semiconductor package structure 100 according to an embodiment of the invention. The semiconductor package structure 100 includes a chip 110, a molding compound 120, a plurality of bonding wires 130 and a lead frame 140.

The lead frame 140 includes a tray 141 and a plurality of leads 142. The tray 141 may be electrically connected to a grounding potential of a circuit board (not shown) for serving as a grounding of the semiconductor package structure 100. The chip 110 is disposed on the tray 141 and electrically connected to the leads 142 of the lead frame 140 through the bonding wires 130, such that the chip 110 may be electrically connected to the circuit board through the bonding wires 130 and the leads 142. The molding compound 120 encapsulates the chip 110, the bonding wires 130 and a portion of each lead 142 for protecting these components.

Figure 2:
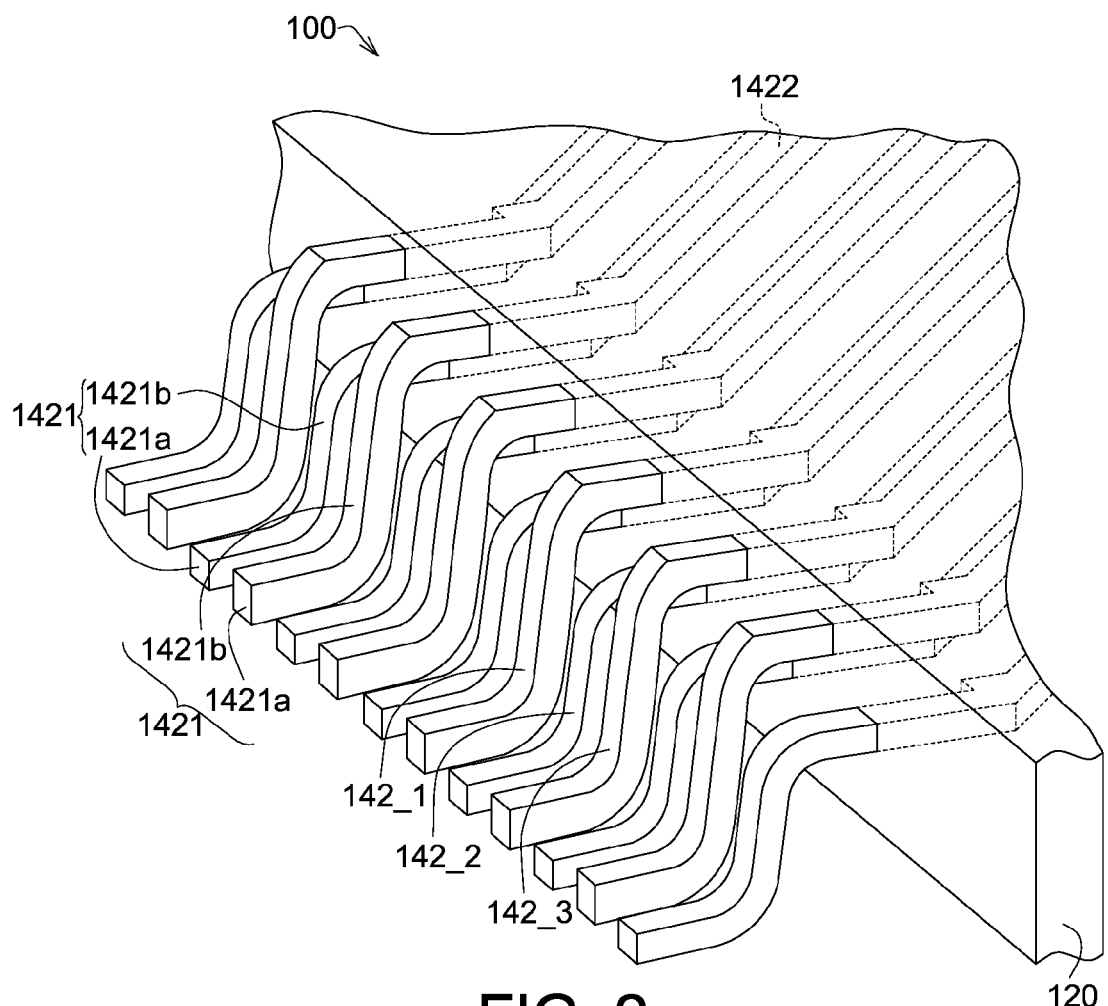
FIG. 2 shows an enlargement view of a local portion a' of the semiconductor package structure of FIG. 1.

FIG. 2 shows an enlargement view of a local portion a' of the semiconductor package structure 100 of FIG. 1. In the present embodiment, two of the leads are different in height position (or are staggered). Each lead 142 includes an outer lead 1421 and an inner lead 1422. The molding compound 120 encapsulates the inner leads 1422, wherein a first terminal 1421a of the outer lead 1421 is exposed.

As shown in FIG. 2, adjacent two outer leads 1421 are different in height position. In an embodiment, any adjacent two of some of the outer leads 1421 of the semiconductor package structure 100 are different in height position. In another embodiment, any adjacent two of all of outer leads 1421 of the semiconductor package structure 100 are different in height position.

Since adjacent two leads 142 are different in height position, the mutual interference of the signal crosstalk of the leads 142 may be reduced, and accordingly the transmission quality of high speed signal may be increased. In addition, the interference of the signal crosstalk may be solved by the staggering of the leads, such that the number of the grounding leads may be reduced, even no grounding lead is required, and the entire semiconductor package structure 100 is electrically grounded only through the tray 141. As a result, more leads 142 or all leads 142 of the semiconductor package structure 100 may serve as the signal leads.

Further, since the interference of the signal crosstalk may be solved by the staggering of the leads, the transmission speed of signal may be increased. According to the result of signal simulation, compared with the leads being the same in height position, the time margin of signal transmission of the semiconductor package structure 100 may increase by a value ranging between 2% and 21%. The signal transmission speed may depend on the number of the staggering leads. For example, the more the number of the staggering leads is, the more the time margin is (it means the transmission speed becomes faster), and vice versa (it means the transmission speed becomes slower).

According to the result of signal simulation, compared with the leads being the same in height position, the mutual inductance value between the lead 142_2 and the adjacent lead 142_1 of the semiconductor package structure 100 may be reduced by a value ranging between 6% and 12%. Similarly, the mutual inductance value between the lead 142_2 and the adjacent lead 142_3 of the semiconductor package structure 100 may be reduced by a value ranging between 6% and 12%. In addition, compared with the leads being the same in height position, the mutual capacitance value between the lead 142_2 and the adjacent lead 142_1 of the semiconductor package structure 100 may be reduced by a value ranging between 42% and 47%. Similarly, the mutual capacitance value between the lead 142_2 and the adjacent lead 142_3 of the semiconductor package structure 100 may be reduced by a value ranging between 42% and 47%. Apparently, since the staggering of the leads or different height of the leads, mutual interference of signal crosstalk of the leads may be reduced.

Figure 3:
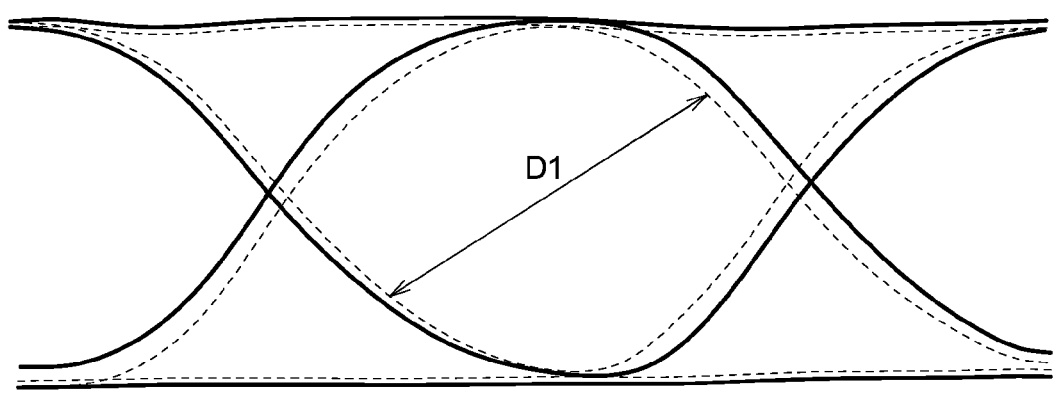
FIG. 3 shows an eye diagram of signal transmission of the semiconductor package structure of FIG. 1.

FIG. 3 shows an eye diagram of signal transmission of the semiconductor package structure 100 of FIG. 1. The eye diagram is a tool of time analysis for making user clearly obtain the error of time and strength. As shown in FIG. 3, the dotted line represents the signal transmission property of the leads that are substantially the same in height position, and the solid line represents the signal transmission property of the semiconductor package structure 100. The better the quality of the signal transmission is, the larger the eye width D1 of the eye diagram is. As shown in FIG. 3, when the signal transmission test is performed (for example, the chip 110 sends out signal), compared with the conventional semiconductor package structure (as shown in the dotted line), the semiconductor package structure 100 has a broader eye width D1 (as shown in solid line) because the semiconductor package structure 100 may reduce the mutual interference between signal crosstalk of the leads. Similarly, the semiconductor package structure 100 of the present embodiment has similar advantage when the signal receiving test is performed (for example, when the chip 110 receives the signal), and the similarity is not be repeated.

In addition, the outer lead 1421 electrically contacts with a pad of the circuit board (not shown) by the first terminal 1421a thereof. The position of the first terminal 1421a of the outer lead 1421 may match with the design of the pad of the circuit board. For example, when several pads of the circuit board are substantially the same in height position, the first terminals 1421a of several outer leads 1421 are substantially the same in height position accordingly. As a result, the leads 1421 may exactly contact with the pads of the circuit board.

In addition, the adjacent two outer leads 1421 are substantially the same in front-and-back position. For example, each outer lead 1421 includes a vertical portion 1421b connecting with the first terminal 1421a, wherein the vertical portion 1421b is exposed from the molding compound 120. In the present embodiment, the vertical portions 1421b of several outer leads 1421 are the same in front-and-back position.

Figure 4:
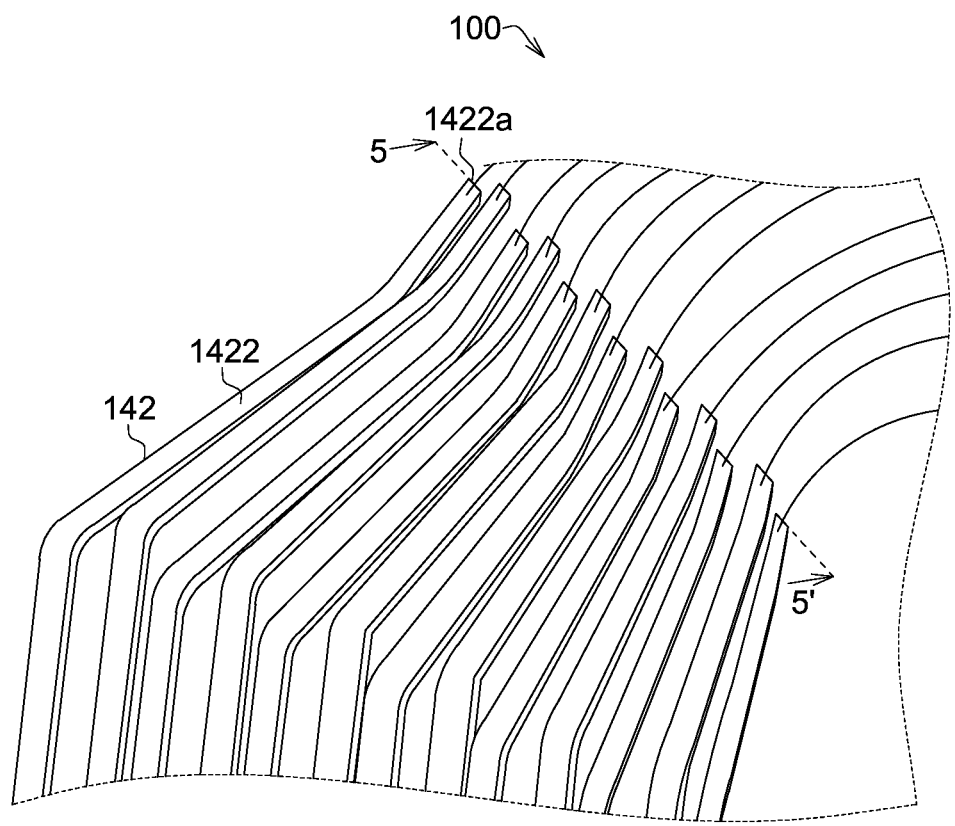
FIG. 4 shows an enlargement view of a local portion b' of the semiconductor package structure of FIG. 1.

FIG. 4 shows an enlargement view of a local portion b' of the semiconductor package structure 100 of FIG. 1. In the present embodiment, the adjacent two inner leads 1422 also may be different in height position. For example, each outer lead 1422 has a second terminal 1422a, wherein the adjacent two second terminals 1422a are different in height position. In addition, in an embodiment, any adjacent two of some inner leads 1422 of the semiconductor package structure 100 are different in height position. In another embodiment, any adjacent two of all of the inner leads 1422 of the semiconductor package structure 100 are different in height position.

In an embodiment, the inner leads 1422 are different in height position, and the outer leads 1421 may be different or the same in height position.

Figure 5:
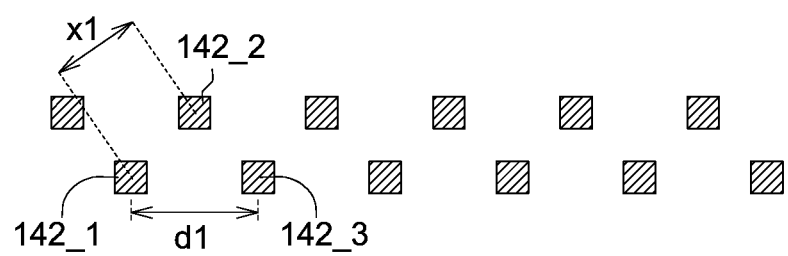
FIG. 5 shows a cross sectional view of the semiconductor package structure of FIG. 4 along a direction 5-5'.

FIG. 5 shows a cross sectional view of the semiconductor package structure 100 of FIG. 4 along a direction 5-5'. In the present embodiment, the adjacent two leads 142 are different in height position, and the non-adjacent two leads 142 are substantially the same in height position. For example, as shown in FIG. 5, the second terminals 1422a of several inner leads 1422 are arranged into two rows in different height positions. In another embodiment, the second terminals 1422a of several inner leads 1422 are arranged into three or more rows in different height positions.

As shown in FIG. 5, the leads 142 include a first lead 142_1, a second lead 142_2 and a third lead 142_3. The first lead 142_1 and the third lead 142_3 are the same in height position. A first interval d1 is included between the first lead 142_1 and the third lead 142_3, and a second interval x1 is included between the first lead 142_1 and the second lead 142_2, wherein the second interval x1 is larger than half of the first interval d1, that is, $x1 \geq d1/2$. As long as the second interval x1 is larger than half of the first interval d1, the staggering interval between the adjacent two leads 142 may be effectively increased, and accordingly the mutual interference between the signal crosstalk may be reduced.

As described above, any adjacent two of some or all of the leads 142 of the semiconductor package structure 100 of the present embodiment may be staggered in height position and/or front-and-back position for increasing the interval between leads and reducing the mutual interference of signal crosstalk of the leads. The staggering way and/or staggering interval of the leads 142 are not limited to the embodiment(s) of the present invention. In addition, in one embodiment, the entire lead 142 and the adjacent entire lead 142 may be staggered. In another embodiment, a portion of the lead 142 and a corresponding portion of the adjacent lead 142 may be staggered, and the other portion of the lead 142 and the other portion of the adjacent lead 142 may be aligned with each other. Further, in the present embodiment, at least portions of at least two leads 142 are staggered. In addition, the staggering direction is, such as, the front-and-back direction (for example, a lateral direction or a crabwise direction of the semiconductor package structure 100), an up-and-down direction (for example, the vertical direction of the semiconductor package structure 100) or an oblique direction (for example, an angle is include between the oblique direction and a bottom surface of the semiconductor package structure 100 ranging 0 degree and 90 degrees).

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package structure connected to a circuit board, comprising:
   a lead frame, comprising:
      a tray; and
      a plurality of leads, wherein each lead has an inner lead, and two of the inner leads are different in height position;
   a chip disposed on the tray and electrically connected to the circuit board through a plurality of bonding wires and the plurality of leads; and
   a molding compound encapsulating the chip and the inner lead of each lead.

2. The semiconductor package structure according to claim 1, wherein each lead has an outer lead exposed from the molding compound, and adjacent two outer leads are different in height position.

3. The semiconductor package structure according to claim 1, wherein each outer lead has an outer lead exposed from the molding compound, and adjacent two outer leads are substantial the same in front-and-back position.

4. The semiconductor package structure according to claim 1, wherein each lead has an outer lead exposed from the molding compound, each outer lead has a first terminal, and adjacent two first terminals are substantial the same in height position.

5. The semiconductor package structure according to claim 1, wherein each inner lead has a second terminal, and adjacent two second terminals are different in height position.

6. The semiconductor package structure according to claim 1, wherein adjacent two leads are different in height position, and non-adjacent two leads are substantial the same in height position.

7. The semiconductor package structure according to claim 1, wherein each lead has a second terminal, and the second terminals are arranged into a plurality of rows which in different in height position.

8. The semiconductor package structure according to claim 1, wherein the leads comprises a first lead, a second lead and a third lead arranged in order, a second interval between the first lead and the second lead is larger than half of a first interval between the first lead and the third lead.

9. The semiconductor package structure according to claim 8, wherein the first lead and the third lead are substantial the same in height position.

10. The semiconductor package structure according to claim 1, wherein the semiconductor package structure is electrically grounded only through the tray.

11. The semiconductor package structure according to claim 1, wherein at least one portion of one of the leads is staggered with respect to at least one portion of another one of the leads.

* * * * *